(12) United States Patent
Hellberg (10) Patent No.: US 6,247,035 B1
(45) Date of Patent: Jun. 12, 2001

(54) REDUCED COMPLEXITY AND INCREASED FLEXIBILITY MODIFIED FAST CONVOLUTION ALGORITHM

(75) Inventor: Richard Hellberg, Huddinge (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/163,298

(22) Filed: Sep. 30, 1998

(51) Int. Cl.[7] ............................ G06F 17/15; G06F 17/14
(52) U.S. Cl. ............................................. 708/420; 708/405
(58) Field of Search ............................. 708/300, 321, 708/403–405, 420; 704/203; 702/77; 709/224; 370/210; 324/76.19; 375/219

(56) References Cited

U.S. PATENT DOCUMENTS

| | | | |
|---|---|---|---|
| 4,636,922 | * 1/1987 | Boland | 708/321 |
| 5,270,953 | 12/1993 | White | 364/724.18 |
| 5,485,395 | * 1/1996 | Smith | 702/77 |
| 5,535,240 | 7/1996 | Carney et al. | 375/219 |
| 5,583,792 | * 12/1996 | Li et al. | 709/224 |
| 5,794,046 | * 8/1998 | Hayashi | 708/300 |
| 5,890,106 | * 3/1999 | Bosi-Goldberg | 704/203 |
| 5,930,231 | * 7/1999 | Miller et al. | 370/210 |

FOREIGN PATENT DOCUMENTS 0 501 690   9/1992 (EP) .

OTHER PUBLICATIONS

"Distortion Analysis of the Bulk FFT Structure for Multi-Carrier Demodulators", Y.O. Al–Jalili, S.K. Barton and S.J. Shepherd, Signal Processing, vol. 42, 1995, pp. 215–219.

"A Flexible On–Board Demultiuplexer/Demodulator", S. Joseph Campanella and Soheil Sayegh, 1988, pp. 299–303.

"Simulation and Analysis of the Distortion Generated by the Bulk–FFT Demultiplexer", S.K. Barton, I.R. Johnson, S.J. Shepherd and P.W.J. van Eetvelt, Signal Processing, vol. 54, 1996, pp. 285–294.

R.E. Crochiere, et al., "Multirate Digital Signal Processing", Prentice–Hall, Englewood Cliffs, XP002104475, Section 7.4, 1983, pps. 346–356.

* cited by examiner

Primary Examiner—Tan V. Mai
(74) Attorney, Agent, or Firm—Burns, Doane, Swecker & Mathis, L.L.P.

(57) ABSTRACT

A modified fast convolution algorithm may be enhanced in order to increase the flexibility of the algorithm. In an exemplary embodiment of the present invention, a folding unit is introduced as a pre-processing stage prior to the Inverse Discrete Fourier Transform (IDFT) in the receiver. The folding unit adds outer frequency components onto inner frequency components in the frequency domain in order to produce a reduced set of frequency components. In an alternative embodiment, an unfolding unit is introduced as a post-processing stage after the Discrete Fourier Transform (DFT) in the transmitter. The unfolding unit expands the set of the set of frequency components by adding translated original components outside the original set. The folding and unfolding processes increase the flexibility of the modified fast convolution algorithm by reducing the number of operations per second that have to be performed for the channel-specific parts of the algorithm. Moreover, since the number of operations per channel decreases, more channels can be treated by a single chip.

21 Claims, 10 Drawing Sheets

REDUCED COMPLEXITY AND INCREASED FLEXIBILITY MODIFIED FAST CONVOLUTION ALGORITHM

BACKGROUND

The present invention relates generally to radio communication systems and, more particularly, to the use of a modified fast convolution algorithm in channelizers and de-channelizers of a radio communication system.

In radio base station applications for cellular, Land Mobile Radio (LMR), satellite, wireless local area networks (WLANs) and other communication systems, many receiving and transmitting channels are handled simultaneously. In the future, mobile terminals, i.e. mobile telephones, will also include this capability. Such systems include digital channelization and de-channelization structures in their receivers and transmitters, respectively. Channelization and de-channelization can be defined as the filtering, decimation/interpolation and the frequency conversion of the signals transmitted and received.

Figure 1:
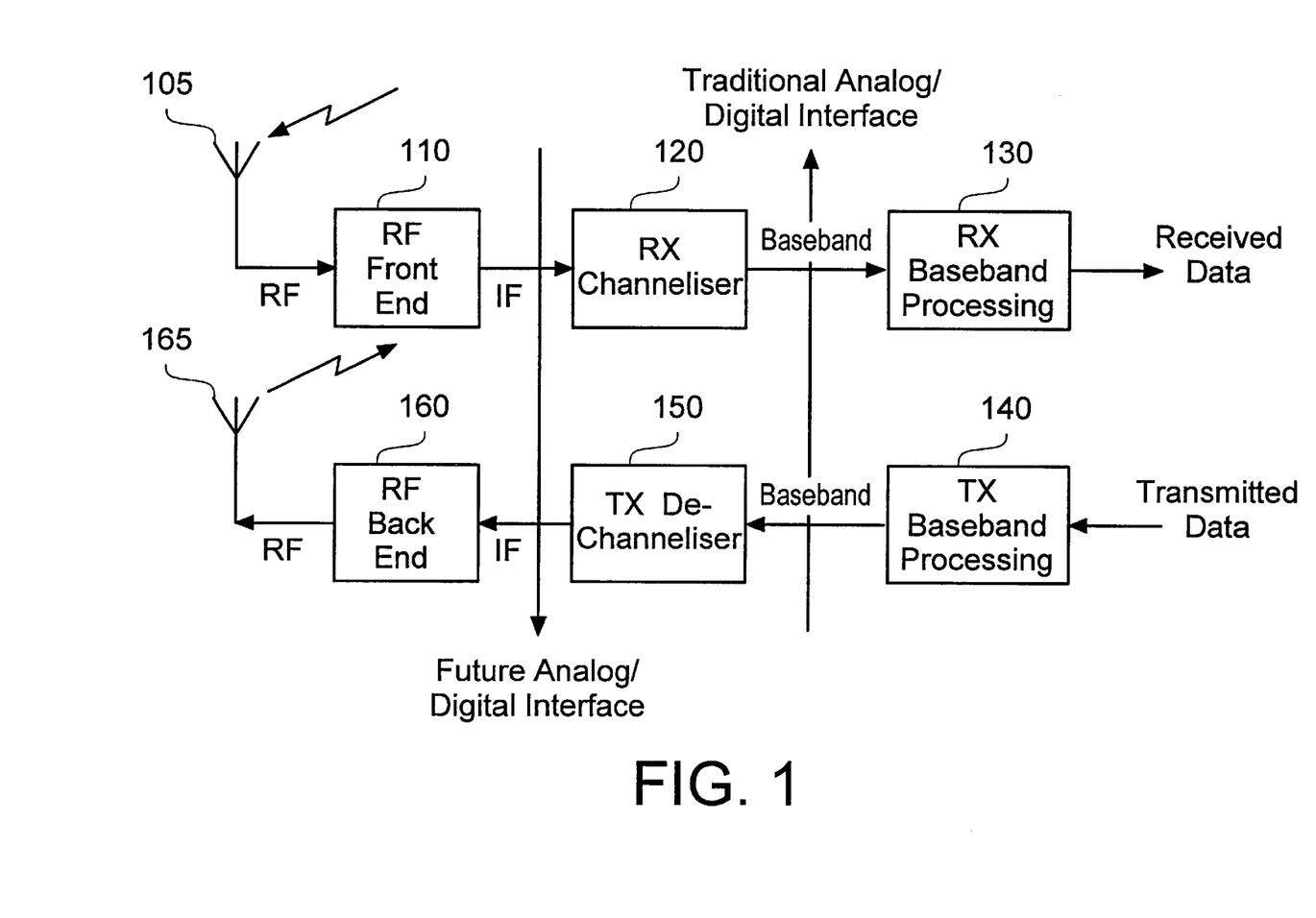
FIG. 1 illustrates a conventional transmitter and receiver.

The traditional receiver architecture is illustrated in FIG. 1. In FIG. 1, a Radio Frequency (RF) signal is received by the antenna 105 and then downconverted to an intermediate frequency (IF) by a RF front end 110. The RF front end 110 consists of components such as Low Noise Amplifiers (LNAs), filters and mixers. The desired channel is then extracted by the receiver channelizer 120. The analog channelizer 120 also consists of LNAs, mixers and filters.

The desired channel is then processed at baseband by the RX baseband processing unit 130 to produce the received digital data stream. Today, baseband processing generally consists of analog-to-digital conversion, digital filtering, decimation, equalization, demodulation, channel decoding, de-interleaving, data decoding, timing extraction, etc.

The traditional transmitter architecture in FIG. 1 is the dual of the receiver architecture. The transmitted data is first processed by the TX baseband processing unit 140 which consists of data coding, interleaving, channel coding, modulation, interpolation filtering, digital-to-analog conversion, etc. The baseband channel is then converted to an IF frequency via the transmit de-channelizer 150. The transmit analog de-channelizer 150 consists of filters, mixers and low power amplifiers. The IF signal is then converted to RF and amplified by the RF front end 160 which consists of mixers, filters, and a high power amplifier. Finally, the signal is transmitted by the antenna 165.

FIG. 1 illustrates the traditional architecture for a single channel receiver and transmitter of a mobile terminal (i.e., mobile phone). In the case of a base station, multiple channels are processed in a similar way. On the receiver side, the path will split at some point to form multiple paths for each channel being processed. On the transmitter side, the channels will be processed individually and then combined at some point to form a multichannel signal. The point of the split and combination varies, and therefore, a variety of base station receiver and transmitter architectures can be created. More importantly, though, the traditional analog and digital interface is currently somewhere between the channelizer and baseband processing blocks.

The analog channelizer/de-channelizer is complex to design and manufacture, and therefore costly. In order to provide a cheaper and more easily produced channelizer/de-channelizer, the future analog and digital interface will lie, instead, somewhere between the RF front end and channelizer blocks. Future radio receiver and transmitter structures of this type are called a variety of names, including multi-channel radio, wideband digital tuners, wideband radio or software radio, and they all require a digital channelizer/de-channelizer.

Efficient digital channelizer/de-channelizer structures, which perform filtering, decimation/interpolation and frequency conversion, are very important in terms of power consumption and die area on a per channel basis. One of the main goals of these structures is to integrate as many channels into a single Integrated Circuit (IC) as possible.

An efficient and flexible method of channelization is presented in copending, commonly assigned, International Patent Application No. PCT/SE99/00971, entitled "Digital Channelizer and De-channelizer," the entirety of which is incorporated here by reference. The method disclosed therein is based upon the fast convolution algorithm, an algorithm for efficient implementation of filters using the correspondence between multiplication in the frequency (Fourier) domain and convolution in the time domain.

Figure 2A:
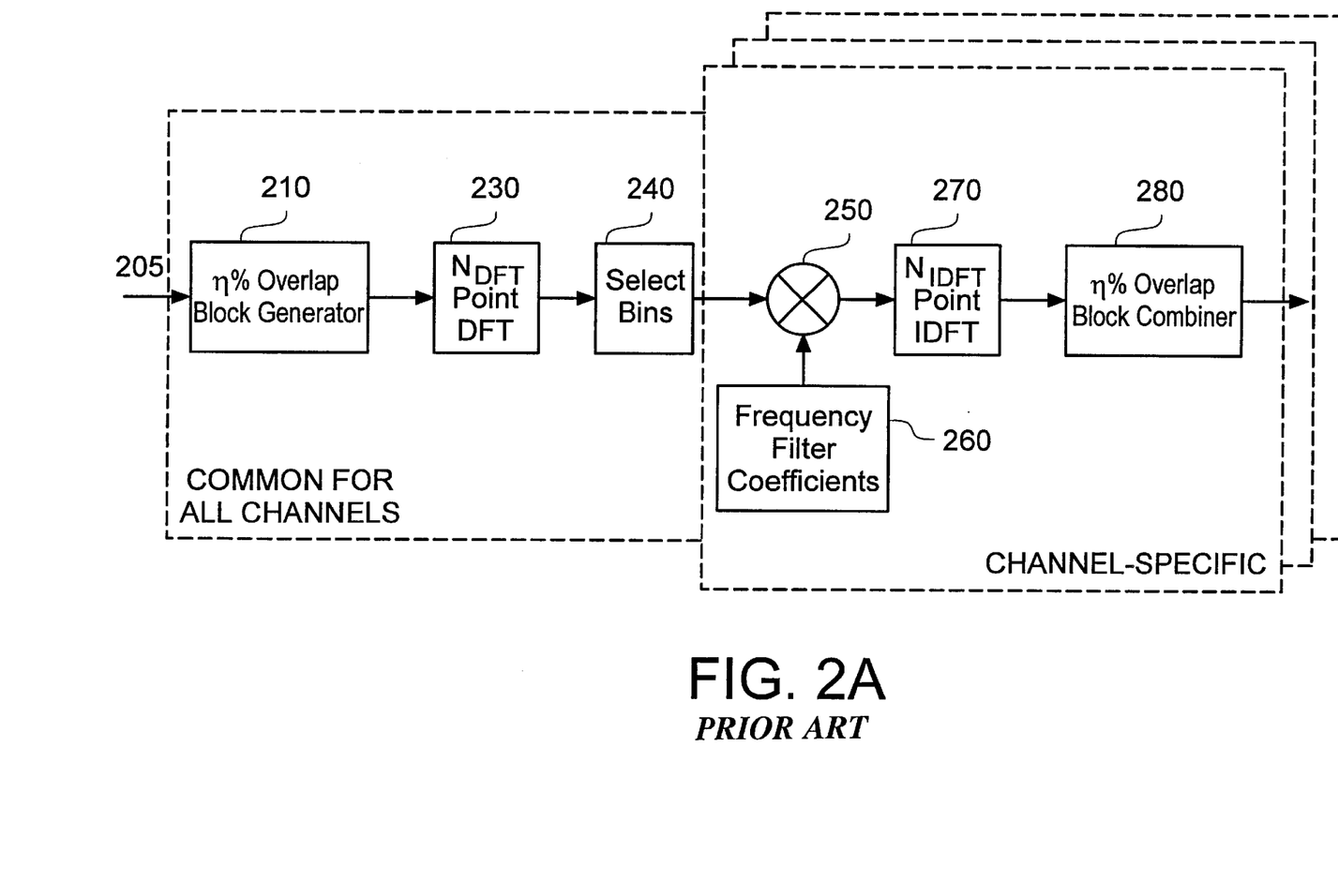
FIG. 2A illustrates the modified fast convolution algorithm applied to a channelizer.
Figure 2B:
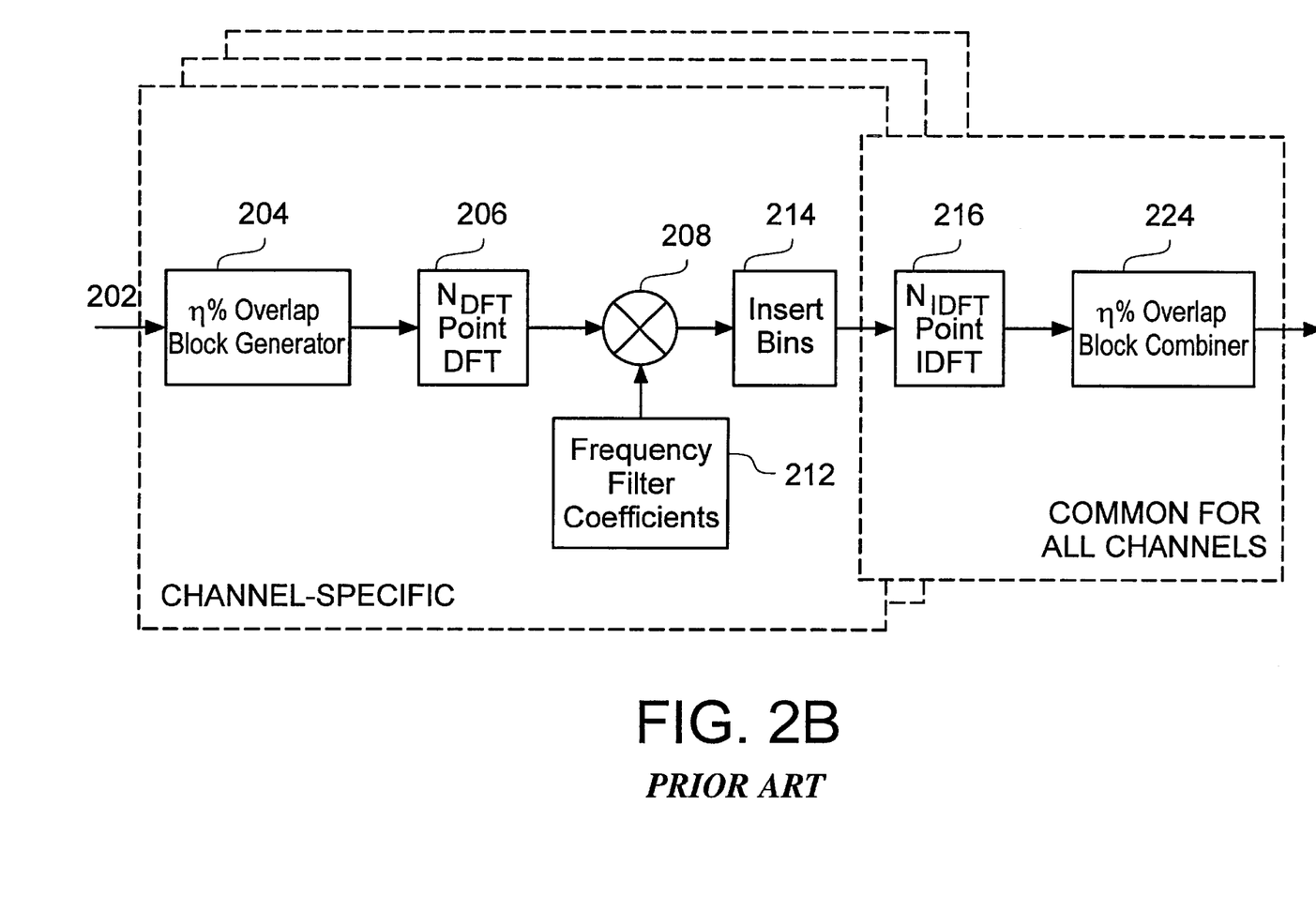
FIG. 2B illustrates the modified fast convolution algorithm applied to a de-channelizer.

FIGS. 2A and 2B illustrate the modified fast convolution algorithm applied to a channelizer and de-channelizer, respectively. In FIG. 2A, an input signal 205 is provided to the channelizer. The input signal 205 is a stream of data coming from a prior process, such as an ADC.

The data stream 205 is first processed by the $\eta$ % overlap block generator 210. This process is based on the amount of percentage overlap, the size of the Discrete Fourier Transform (DFT) and the type of overlap, that is overlap/add or overlap/save as discussed below. In the case of overlap and add, the data stream is chopped into non-overlapping sections of length $N_{DFT}(1-\eta)$, and padded with $N_{DFT}\eta$ zeros to form a single block. In the case of overlap and save the data is chopped into blocks of length $N_{DFT}$, which have an overlap with the previous block given by a length of $N_{DFT}\eta$.

The resulting blocks are then input into the DFT algorithm. The DFT algorithm is completed in block 230. As a result of pipeline FFT processing, the output of the FFT is not in the correct order. Therefore, the bin select and extract block 240 must compensate for this by reordering the output sequence and only selecting the bins needed. The number of bins needed depends on the number of filter coefficients 260.

The selected bins are multiplied with the filter frequency coefficients 260 in multiplier 250. An inverse Discrete Fourier Transform (inverse-DFT or IDFT) 270 is then completed on the result of the previous multiplication.

The output of the IDFT is inserted into the $\eta$ % overlap block combiner 280. The combination operation depends on the % overlap of the blocks and whether an overlap/save or an overlap/add is being employed. For either overlap and add or overlap and save, the blocks are overlapped with the previous block by a length equal to $N_{IDFT}\eta$. For overlap and add, the overlapping part of the block is added to the previous block's corresponding overlapping part, while for overlap and save the overlapping part of the block is simply discarded. For both overlap and add and overlap and save there are no operations performed on the non-overlapped part of the block.

FIG. 2B illustrates the modified fast convolution algorithm as applied to a de-channelizer. The input signal is a stream of data 202 coming from a prior process, such as an ADC operation. In contrast to FIG. 2A, the input data stream is specific to one channel, rather than a stream combining many channels.

The data stream 202 is first processed by the $\eta$ % overlap block generator 204. This process is largely based on the amount of percentage overlap, the size of the DFT and the type of overlap, that is overlap/add or overlap/save. In the case of overlap and add, the data stream is chopped into nonoverlapping sections of length $N_{DFT}*(1-\eta)$, and padded with $N_{DFT}*\eta$ zeros to form a single block. In the case of overlap and save the data is chopped into blocks of length $N_{DFT}$, which have an overlap with the previous block given by a length of $N_{DFT}*\eta$.

A Discrete Fourier Transform (DFT) 206 is then completed on the result of the previous operation. One skilled in the art will appreciate that the DFT 206 could, in the alternative, be implemented as an FFT. As contrasted with the receiver in FIG. 2A, the DFT 206 structure is small and the IDFT 216 structure is large, the opposite of the receiver.

The block is then multiplied by multiplier 208 with filter frequency coefficients 212. The frequency filter coefficients 212 are equivalent to the DFT of the impulse response.

The results of the multiplication are then input by the insert bins block 214 into the Inverse Discrete Fourier Transform (IDFT) 216 and the IDFT algorithm is then completed. The output of the IDFT algorithm is processed by the $\eta$ % overlap block combiner 224.

The blocks are combined in the block combiner 224 depending on their %overlap and whether an overlap/save or overlap/add is being employed. For either overlap and add or overlap and save, the blocks are overlapped with the previous block by a length equal to $N_{IDFT}*\eta$. For overlap and add, the overlapping part of the block is added to the previous blocks corresponding overlapping part, while for overlap and save the overlapping part of the block is simply discarded. For both overlap and add and overlap and save there are no operations performed on the non-overlapped sections.

Copending, commonly assigned U.S. patent application Ser. No. 09/156,630, entitled "Flexibility Enhancement to the Modified Fast Convolution Algorithm," the entirety of which is incorporated herein by reference, sets forth in greater detail the operation of the components of FIGS. 2A and 2B.

In the modified fast convolution algorithm as used in state of the art channelizers, the number of points in the IDFT (computed by IFFT) is a power of two. The same or a slightly lower number of frequency coefficients are used in the frequency-domain filter.

A problem with the state of the art systems is that when an IDFT/DFT size is chosen, the maximum number of frequency components is limited (to the number of frequency components in the IDFT/DFT) and therefore the ultimate filter rejection is also limited. This means that either the required rejection cannot be obtained, or it may be necessary to choose a IDFT/DFT that is twice as large in order to fit the frequency components. The number of operations can, therefore, increase drastically because of a small increase in the required filter rejection. In short, in the state of the art solution the different system parameters (i.e., filter bandwidth, DFT/IDFT size and sampling rate) are very tightly connected.

In the channel-specific part of channelizers based on the modified fast convolution algorithm, the small IDFT in a receiver and the small DFT in a transmitter require many operations for their computations. This limits the number of channels that can be channelized/de-channelized both because of the power dissipation and the limited number of processing elements that can be incorporated into the same chip. If a hardwired channel-specific part is used, the power consumption is the main limiting factor. If a flexible architecture based on programmable processors is desired, the number of operations, even trivial and low-power, can limit the number of channels that can be handled. Thus, there is a strong incentive to reduce the number of operations in the channel-specific parts of the modified fast convolution algorithm.

SUMMARY

The present invention seeks to enhance the above-described modified fast convolution algorithm in order to increase the flexibility of the algorithm. In an exemplary embodiment of the present invention, a folding unit is introduced as a pre-processing stage prior to the IDFT in the receiver. The folding unit adds outer frequency components onto inner frequency components in the frequency domain in order to produce a reduced set of frequency components.

In an alternative embodiment, an unfolding unit is introduced as a post-processing stage after the DFT in the transmitter. The unfolding unit expands the set of the set of frequency components by adding translated original components outside the original set.

The folding and unfolding processes increase the flexibility of the modified fast convolution algorithm by reducing the number of operations per second that have to be performed for the channel-specific parts of the algorithm. Moreover, since the number of operations per channel decreases, more channels can be treated by a single chip.

BRIEF DESCRIPTION OF THE DRAWINGS

The above objects and features of the present invention will be more apparent from the following description of the preferred embodiments with reference to the accompanying drawings, wherein.

DETAILED DESCRIPTION

Figure 3:
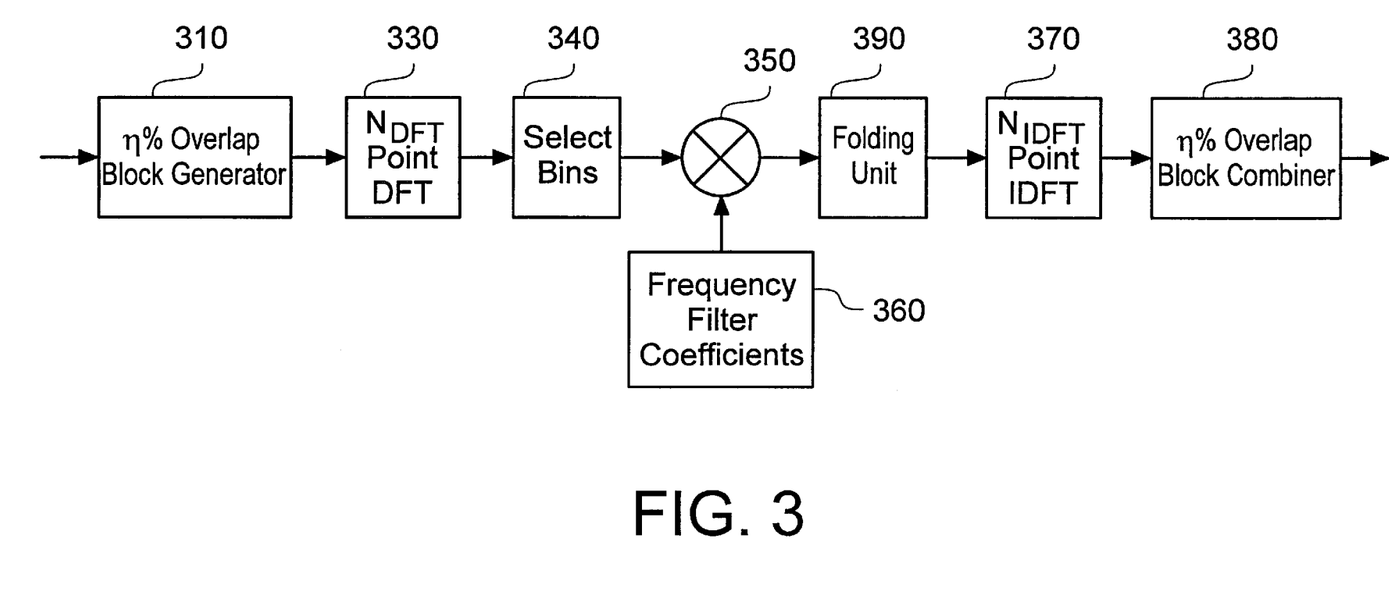
FIG. 3 illustrates the modified fast convolution algorithm applied to a channelizer according to an exemplary embodiment of the present invention.

FIG. 3 illustrates the modified fast convolution algorithm applied to a channelizer according to an exemplary embodiment of the present invention. Similar to the description of FIG. 2A above, the modified fast convolution algorithm applied to the channelizer of the present invention illustrated in FIG. 3 includes a η % overlap block generator 310, a large $N_{DFT}$ point DFT 330, a select bins block 340, a multiplier 350 for multiplying the selected bins with frequency filter coefficients 360, a smaller $N_{IDFT}$ point IDFT 370 and η % overlap block combiner 380 which operate in a manner similar to that described above. In addition, the system according to the present embodiment includes a folding unit 390 which performs the inventive folding process.

The folding unit 390 adds selected frequency components onto other frequency components, which hereafter will be called "folding" in the frequency domain. Frequency folding is the process of adding outer frequency components onto the remaining inner frequency components.

Figure 4:
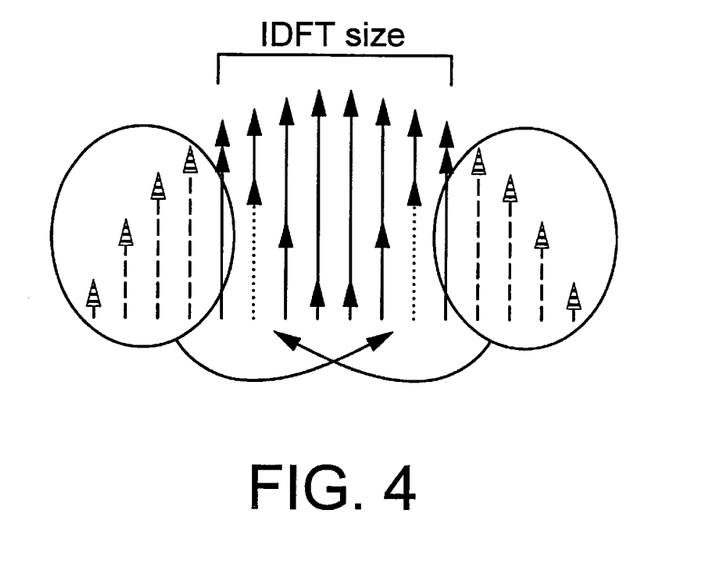
FIG. 4 illustrates the folding process according to an embodiment of the present invention.

FIG. 4 illustrates the folding process. In FIG. 4, 16 frequency components are folded into 8 frequency components by adding the outer 4 components on the left to the inner 4 components on the right and adding the outer 4 components on the right to the inner 4 components on the left. One skilled in the art will appreciate that since the signal is a complex signal comprising imaginary and real parts, the convolution will take place in the complex plane and, therefore, the right outer frequency components, when convoluted, will be shifted by −90° and will land at the locations indicated in FIG. 4.

As a result of the folding process, the original 16 frequency components are reduced down to 8 frequency components. The folding process of the present invention results in a reduced set of frequency components that can be processed in a smaller IDFT 370 than would otherwise be the case. The forming of the 8-point set shown in FIG. 4 can be written simply as $$Y_{0-3} = X_{4-7} + X_{12-15}$$

$$Y_{4-7} = X_{8-11} + X_{0-3}.$$

Figure 5:
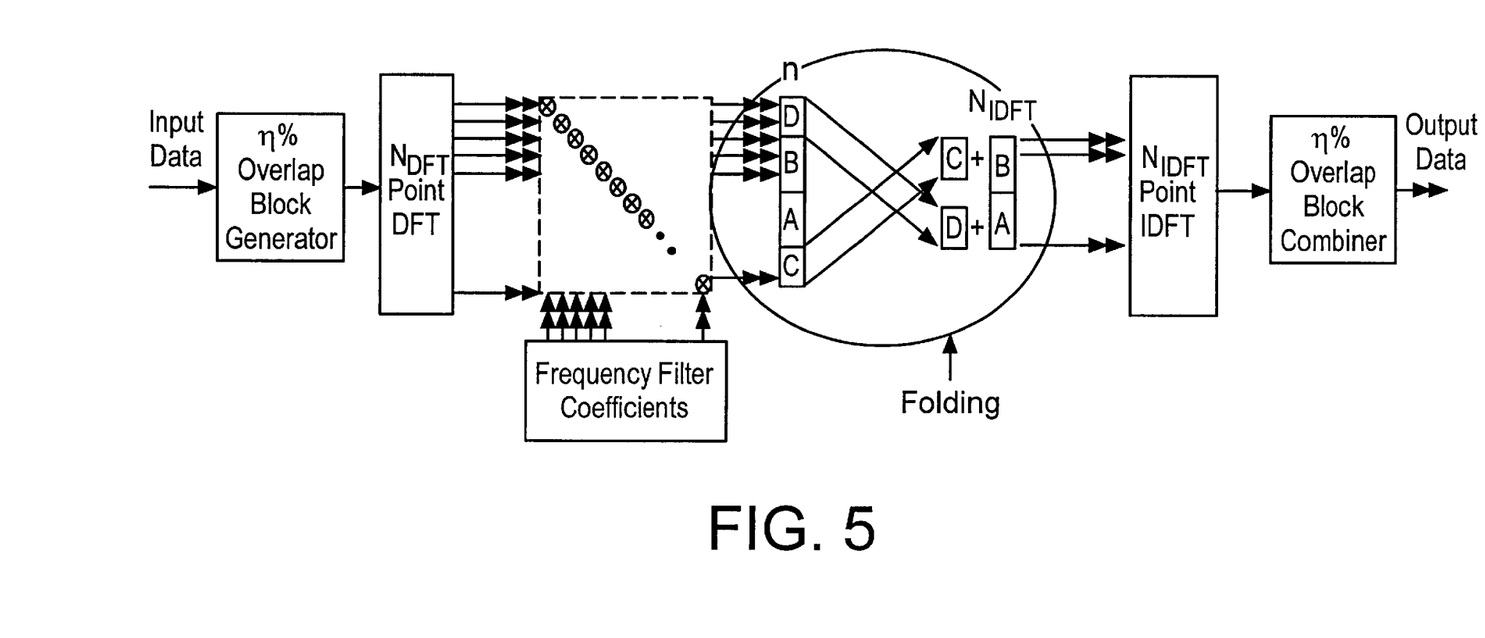
FIG. 5 illustrates the placement of the folding process in the modified fast convolution algorithm according to the present invention.

FIG. 5 illustrates the placement of the folding process within the modified fast convolution algorithm set forth in FIG. 3. The folding process is performed after the bins have been multiplied with the frequency filter coefficients and before the data is fed to the IDFT. As is evident from FIG. 5, the exemplary multiplier outputs four frequency components labeled D, B, A and C. The folding unit folds the outer frequency components D and C onto the inner components A and B so as to reduce the number of frequency components that are needed to be processed by the IDFT.

Figure 6:
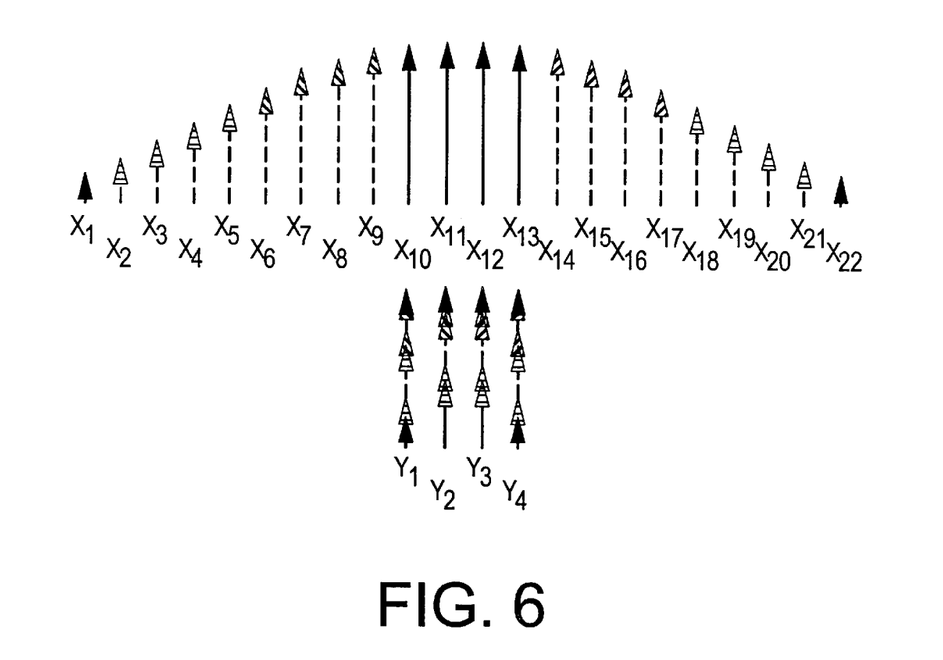
FIG. 6 illustrates a higher order folding process according to an embodiment of the present invention.

According to an exemplary embodiment of the present invention, folding in the frequency domain can be expanded to higher orders. That is, the frequency components can be folded inwards and added more than once, as illustrated in FIG. 6. This means that three or more components are added together to form one input component to the IDFT. As illustrated in FIG. 6, 22 frequency components, labeled $X_1$–$X_{22}$, are folded via the folding process of the present invention into 4 frequency components $Y_1$–$Y_4$. This folding process would allow a 4-point DFT to process the 22 frequency components in a single operation.

High order folding is especially useful if the filter rejection has to be very high far from the carrier while the requirements are quite loose close to the carrier. A general formula for higher order folding is set forth below. For the output frequency components $Y_k$ in a set that will be processed in an N-point IDFT the expression reads $$Y_k = \sum_{n=-N_{kl}}^{N_{ku}} X_{C_0+k+N\times n} \bigg|_{0 \le k < N}$$

where $C_0$ is the number of the center frequency point in the input data and $N_{ku}$ and $N_{kl}$ are the number of frequency components that will be added to the output bin with index k originating above or below $C_0$, respectively.

Figure 7:
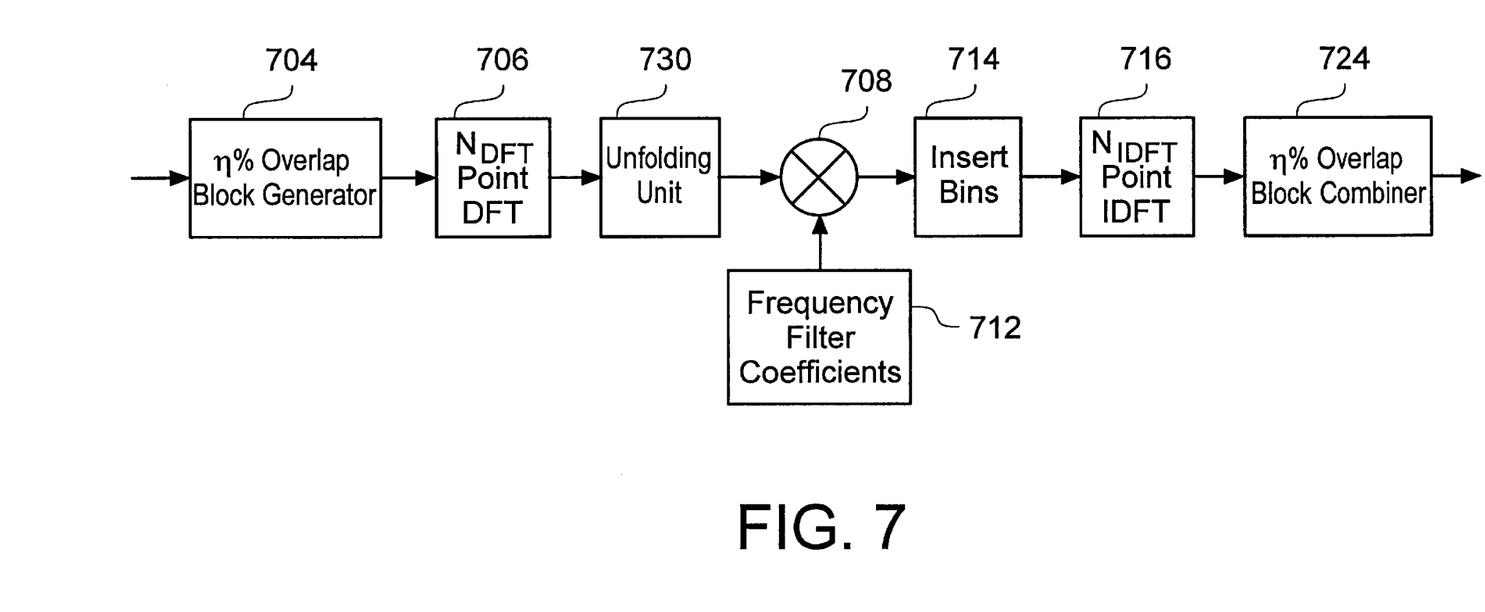
FIG. 7 illustrates the modified fast convolution algorithm applied to a de-channelizer according to an exemplary embodiment of the present invention.

FIG. 7 illustrates the modified fast convolution algorithm applied to a de-channelizer according to an exemplary embodiment of the present invention. Similar to the description set forth above with respect to FIG. 2B, the modified fast convolution algorithm applied to the de-channelizer of the present invention set forth in FIG. 7 includes a η % overlap block generator 704, a small $N_{DFT}$ point DFT 706, a multiplier 708 for multiplying bins with frequency filter coefficients 712, an insert bins block 714, a larger $N_{IDFT}$ point IDFT 716 and a η % overlap block combiner 724 which operate in a manner similar to that discussed previously. In addition, the system according to the present embodiment includes an unfolding unit 730 which performs the inventive unfolding process.

Figure 8:
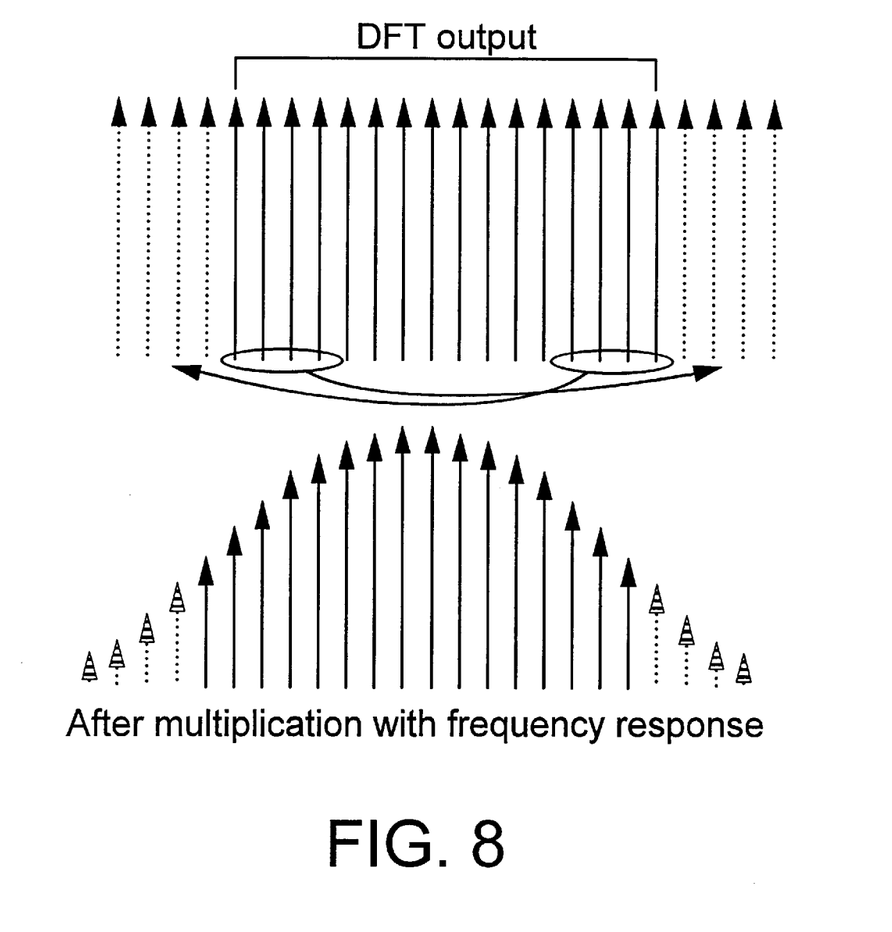
FIG. 8 illustrates the unfolding process according to an embodiment of the present invention.

The unfolding unit 730 expands the set of frequency components output from the DFT 706 by adding translated original components outside the original set. The concept of unfolding is illustrated in FIG. 8. In FIG. 8, a 24-point set is formed from 16 frequency components coming from a 16-point DFT. As illustrated, the 4 left-most frequency components of the original set are added to the right of the right-most frequency component of the original set and the 4 right-most frequency components of the original set are added to the left of the left-most frequency component of the original set. As a result, a new 24-point frequency response is created. This new 24-point frequency response is then multiplied with a 24-point frequency response (i.e., 24 frequency filter coefficients) without having to perform a larger DFT operation.

The forming of the 24-point set in FIG. 8 can be written as $$Y_{4-19} = X_{0-15}$$

$$Y_{0-3} = X_{12-15}$$

$$Y_{20-23} = X_{0-3}$$

where $X_k$ denotes the input components and $Y_k$ denotes the output components.

Figure 9:
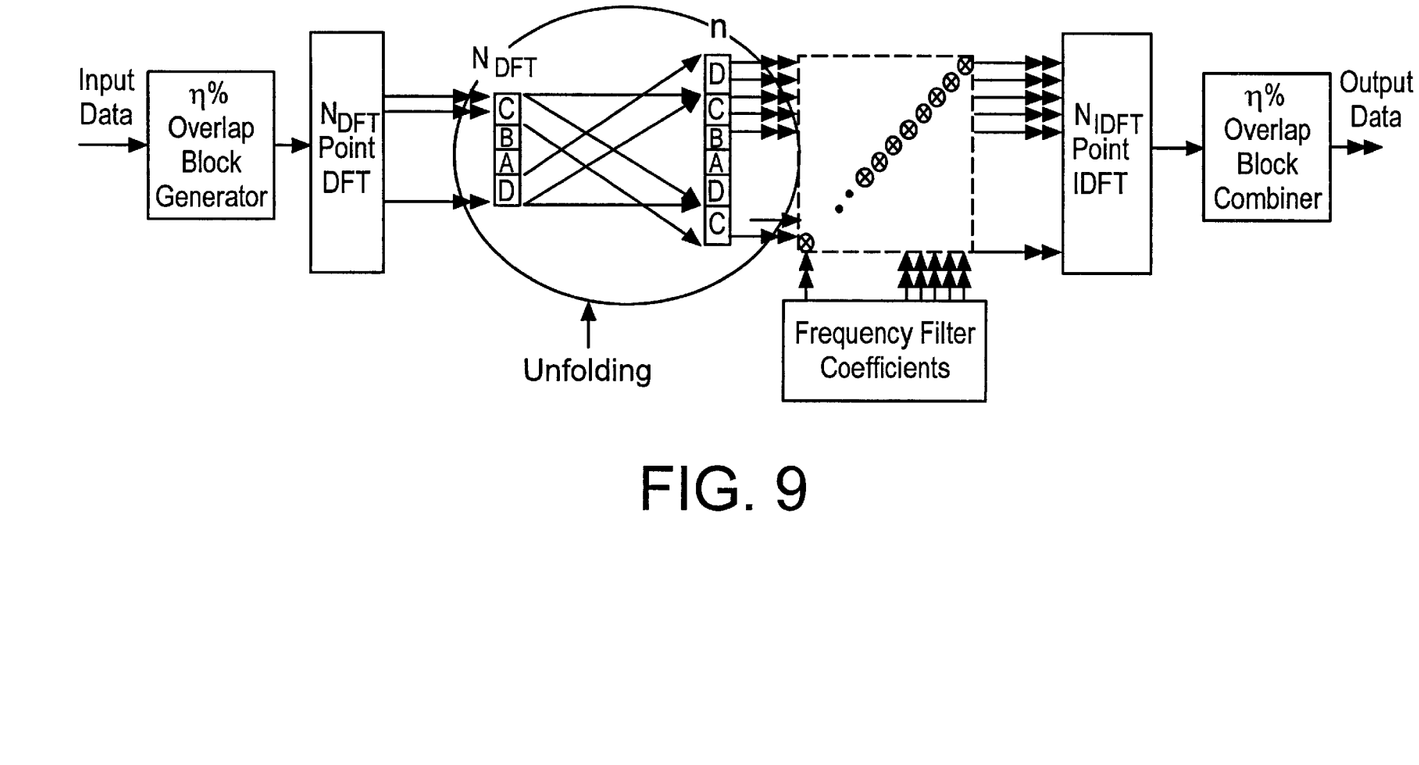
FIG. 9 illustrates the placement of the unfolding process in the modified fast convolution algorithm according to the present invention.

FIG. 9 illustrates the placement of the unfolding process within the modified fast convolution algorithm set forth in FIG. 7. The unfolding process is performed after the DFT operation and before the data is multiplied with the frequency filter coefficients. As is evident from FIG. 9, the exemplary DFT outputs four frequency components labeled C, B, A and D. The unfolding unit adds components C and D outside the original set of components to form a six frequency component set (D, C, B, A, D and C).

The process of unfolding can also be expanded to higher order so that the small number of DFT frequency components fed to the frequency response multiplication are used several times.

A general formula for unfolding including higher order is set forth below. For the output frequency components $Y_{C_0+k+N*n}$ formed by unfolding the components of an N-point DFT the expression reads $$Y_{C_0+k+N\times n} = X_k \Big|_{\substack{-N_{kl} \le n \le N_{ku} \\ 0 \le k < N}}$$

where $C_0$ is the number of the center frequency point in the output data and $N_{ku}$ and $N_{kl}$ are the number of frequency components that are formed from the input component with index k inserted above or below $C_0$, respectively.

As illustrated above, by performing frequency domain folding in a receiver, it is possible to have the DFT output multiplied with a filter response wide enough to prevent wideband aliasing, and the result of this operation folded into the smallest IDFT possible without introducing aliasing from the nearest adjacent channels. Using the concept of frequency-domain unfolding in a transmitter, it is possible to have a DFT output smaller than the filter response, and then expand it to the necessary width before multiplying with the frequency response.

Frequency domain folding and unfolding improves flexibility by removing restrictions on the frequency domain filter and also decoupling the filtering requirements from the DFT/IDFT length. Folding/unfolding can be used to get correct sampling rates independently of changes in filter bandwidth or stopband suppression.

Folding and unfolding in the frequency domain significantly reduces the number of operations per second that have to be performed for the channel-specific parts of the modified fast convolution algorithm. It also reduces the memory requirements. Since the number of operations per channel decreases, more channels can be treated in the same chip. As a result, a processor-based architecture becomes more feasible.

The present invention is applicable to all types of fast convolution algorithms where a change in sampling rate is involved and especially when there are very tough stopband requirements. The relative reduction in the number of operations achieved by the present invention depends in part on the total number of operations that are due to the IDFT/DFT. By reducing the IDFT size from 32 to 16 points, the number of multiplication operations that are needed reduces from 88 to 24 when the IDFT is computed by a radix-2 IFFT. This reduction by 3.7 times reflects in a corresponding decrease in power consumption. The number of arithmetic operations (additions plus multiplications) goes down from 496 to 176, a 2.8 times decrease.

Figure 10:
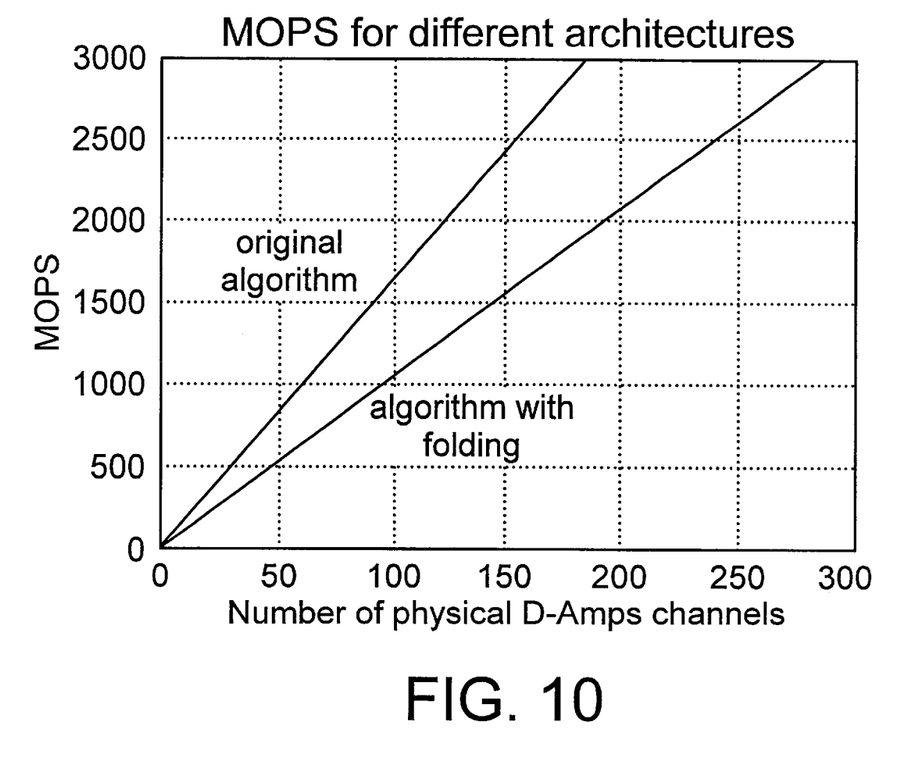
FIG. 10 illustrates a comparison of the performance of the state of the art modified fast convolution algorithm and the modified fast convolution algorithm of the present invention.

FIG. 10 illustrates a comparison of the computational complexity in million operations per second (excluding memory operations) between the state of the art algorithm and the folding algorithm of the present invention. The comparison was made at a sampling frequency of 61.44 MHz and total decimation of 512x. As is evident from the figure, the folding algorithm of the present invention permits a greater number of channels to be processed than the state of the art algorithm.

The foregoing has described the principles, preferred embodiments and modes of operation of the present invention. However, the invention should not be construed as being limited to the particular embodiments discussed above. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A system for enhancing a modified fast convolution algorithm applied to a channelizer, said system comprising:
    a η % overlap block generator for converting a received data stream into blocks;
    means for performing a $N_{DFT}$-point Discrete Fourier Transform (DFT) on said blocks to form frequency components;
    means for selecting frequency components;
    a multiplier for multiplying said selected frequency components with frequency filter coefficients;
    means for folding said multiplied frequency components into a smaller number of frequency components;
    means for performing a $N_{IDFT}$-point Inverse Discrete Fourier Transform (IDFT) on said folded frequency components; and
    a η % overlap block combiner.

2. The system of claim 1 wherein the means for folding adds outer frequency components to inner frequency components in order to produce said smaller number of components.

3. The system of claim 2, wherein said means for folding comprises:
    means for adding a first number of the outer frequency components to a first number of the inner frequency components; and
    means for adding a second number of the outer frequency components to a second number of the inner frequency components, wherein the addition of the first number of outer frequency components to the first number of inner frequency components and the addition of the second number of outer frequency components to the second number of inner frequency components are symmetric processes.

4. The system of claim 2, wherein said means for folding comprises:
    means for adding a first number of the outer frequency components to a first number of the inner frequency components; and
    means for adding a second number of the outer frequency components to a second number of the inner frequency components, wherein each of the frequency components corresponding to the first number of outer frequency components are higher in frequency than each of the frequency components corresponding to the second number of outer frequency components, and wherein each of the frequency components corresponding to the first number of inner frequency components are lower in frequency than each of the frequency components corresponding to the second number of inner frequency components.

5. The system of claim 1 wherein said means for folding is located between said multiplier and said means for performing a $N_{IDFT}$-point Inverse Discrete Fourier Transform.

6. The system of claim 1 wherein said means for folding performs a higher order folding where three or more frequency components are added together to form one input component to the IDFT.

7. A method for enhancing a modified fast convolution algorithm applied to a channelizer, said method comprising the steps of:
    processing blocks of data with a $N_{DFT}$-point Discrete Fourier Transform (DFT) to form frequency components;
    multiplying selected frequency components with frequency filter components;
    folding the multiplied frequency components into a smaller number of frequency components;

performing a $N_{IDFT}$-point Inverse Discrete Fourier Transform (IDFT) on the folded frequency components to form filtered data blocks; and combining said filtered data blocks into a continuous data stream.

8. The method of claim 7 wherein the folding step comprises the step of:

adding outer frequency components to inner frequency components in order to produce said smaller number of components.

9. The method of claim 8, wherein said step of folding the multiplied frequency components into a smaller number of frequency components comprises the steps of:

adding a first number of the outer frequency components to a first number of the inner frequency components; and adding a second number of the outer frequency components to a second number of the inner frequency components, wherein the addition of the first number of outer frequency components to the first number of inner frequency components and the addition of the second number of outer frequency components to the second number of inner frequency components are symmetric processes.

10. The method of claim 8, wherein said step of folding the multiplied frequency components into a smaller number of frequency components comprises the steps of:

adding a first number of the outer frequency components to a first number of the inner frequency components; and adding a second number of the outer frequency components to a second number of the inner frequency components, wherein each of the frequency components corresponding to the first number of outer frequency components are higher in frequency than each of the frequency components corresponding to the second number of outer frequency components, and wherein each of the frequency components corresponding to the first number of inner frequency components are lower in frequency than each of the frequency components corresponding to the second number of inner frequency components.

11. The method of claim 7 wherein said step of folding is a higher order folding step where three or more frequency components are added together to form one input component to the IDFT.

12. A system for enhancing a modified fast convolution algorithm applied to a de-channelizer, said system comprising:

a η % overlap block generator for converting a data stream into blocks;

means for performing a $N_{DFT}$-point Discrete Fourier Transform on said blocks to form an original set of frequency components;

means for unfolding the original set of frequency components to form a larger number of frequency components;

a multiplier for multiplying said larger number of frequency components with frequency filter coefficients;

means for inserting the multiplied frequency components into a $N_{IDFT}$-point Inverse Discrete Fourier Transform;

means for performing the $N_{IDFT}$-point Inverse Discrete Fourier Transform; and a η % overlap block combiner.

13. The system of claim 12 wherein said means for unfolding expands a smaller number of frequency components into a larger number of frequency components by adding original components outside the original set.

14. The system of claim 13 wherein said means for unfolding performs a higher order unfolding where larger number is more than twice the smaller number.

15. The system of claim 13, wherein said means for unfolding comprises:

means for adding a first number of outer frequency components, wherein the one outer frequency component, associated with the first number of outer frequency components, having the lowest frequency is greater in frequency than any of the original set of frequency components; and means for adding a second number of outer frequency components, wherein the one outer frequency component, associated with the second number of outer frequency components, having the highest frequency is lower in frequency than any of the original set of frequency components.

16. The system of claim 15, wherein the first number of outer frequency components and the second number of outer frequency components are equal.

17. A method for enhancing a modified fast convolution algorithm applied to a de-channelizer, said method comprising the steps of:

performing a $N_{DFT}$-point Discrete Fourier Transform on overlapping blocks of data to produce an original set of frequency components;

unfolding said original set of frequency components in order to form a larger number of frequency components;

multiplying said larger number of frequency components with frequency filter coefficients;

performing a $N_{IDFT}$-point Inverse Discrete Fourier Transform on the multiplied frequency components to obtain data blocks; and combining said data blocks into a continuous data stream.

18. The method of claim 17 wherein the step of unfolding expands a smaller number of frequency components into a larger number of frequency components by adding original components outside the original set.

19. The method of claim 18 wherein the step of unfolding is a higher order unfolding where said larger number is more than twice the smaller number.

20. The method of claim 18, wherein said step of unfolding said original set of frequency components in order to form a larger number of frequency components comprises the steps of:

adding a first number of outer frequency components, wherein the one outer frequency component, associated with the first number of outer frequency components, having the lowest frequency is greater in frequency than any of the original set of frequency components; and adding a second number of outer frequency components, wherein the one outer frequency component, associated with the second number of outer frequency components, having the highest frequency is lower in frequency than any of the original set of frequency components.

21. The method of claim 20, wherein the first number of outer frequency components and the second number of outer frequency components are equal.

* * * * *